United States Patent [19]

Uchida et al.

[11] Patent Number: 5,346,743
[45] Date of Patent: Sep. 13, 1994

[54] RESIN ENCAPSULATION TYPE SEMICONDUCTOR DEVICE

[75] Inventors: Ken Uchida, Tokyo; Michiya Higashi; Shinetsu Fujieda, both of Kawasaki, all of Japan

[73] Assignee: Kabushiki Kaisha Toshiba, Kawasaki, Japan

[21] Appl. No.: 28,696

[22] Filed: Mar. 8, 1993

[30] Foreign Application Priority Data

Mar. 13, 1992 [JP] Japan ................. 4-054712
Mar. 13, 1992 [JP] Japan ................. 4-054713

[51] Int. Cl.$^5$ ................................ C08G 59/32
[52] U.S. Cl. ...................... 428/76; 174/52.2; 257/789; 257/793
[58] Field of Search ............... 428/76; 525/482, 484; 523/465; 257/793, 789; 174/52.2

[56] References Cited

U.S. PATENT DOCUMENTS

| | | | |
|---|---|---|---|
| 4,816,496 | 3/1989 | Wada et al. | 522/17 |
| 5,001,174 | 3/1991 | Yanagisawa et al. | 525/482 |

FOREIGN PATENT DOCUMENTS

| | | |
|---|---|---|
| 62-19068 | 4/1987 | Japan . |
| 2-222441 | 9/1990 | Japan . |
| 3-13258 | 2/1991 | Japan . |

*Primary Examiner*—Alexander S. Thomas
*Attorney, Agent, or Firm*—Oblon, Spivak, McClelland, Maier & Neustadt

[57] ABSTRACT

According to a first embodiment of the present invention, there is provided a resin encapsulation type semiconductor device, comprising a semiconductor element and an epoxy resin composition used as an encapsulating resin, the composition containing as essential components:

(a) an epoxy resin represented by formula (I) given below:

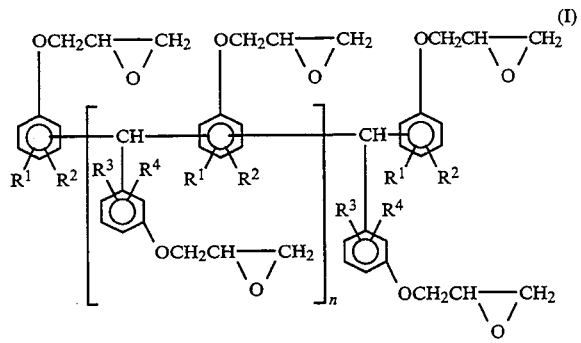

where $R^1$, $R^2$, $R^3$, and $R^4$ are hydrogen or an alkyl group respectively, and $n \geq 0$,
(b) a phenolic resin curing agent,
(c) an imidazole compound, and
(d) triphenyl phosphate.

In the first embodiment of the present invention, a heat resistance skeletal structure is formed by the epoxy resin (a) and the phenolic resin curing agent (b) in the epoxy resin composition after cured, leading to an improved resistance to heat and to an improved package crack resistance. Further, the combination of the imidazole compound (c) used as a curing catalyst and triphenyl phosphate (d) permits ensuring a high reliability in terms of the humidity resistance and also permits improving the resistance to the external contamination.

20 Claims, 1 Drawing Sheet

F I G. 1

F I G. 2

RESIN ENCAPSULATION TYPE SEMICONDUCTOR DEVICE

BACKGROUND OF THE INVENTION

1. Field of the Invention

The present invention relates to a resin encapsulation type semiconductor device, in which a semiconductor element is encapsulated with an epoxy resin composition.

2. Description of the Related Art

A novolak type epoxy resin composition using, for example, a phenolic novolak resin as a curing agent is excellent in its moldability. In addition, the composition is excellent in molding characteristics and the cured product of that is excellent in its resistance to humidity (i.e., resistance to moisture) and electrical characteristics under high temperatures. Thus, the composition of this type is widely used for encapsulating a semiconductor device.

In recent years, miniaturization of each functioning member of a semiconductor element and enlargement of the element itself are being rapidly promoted in the field of a resin encapsulation type semiconductor device in accordance with progress in the integration density of the semiconductor element. As a result, required are the mounting of the element at a high density and automation of the assembling process. Under the circumstances, the mounting process of a semiconductor device is being changed from the conventional pin insertion type to a surface mounting type.

The surface mounting method for mounting a semiconductor device to a substrate is applied to, for example, the mounting of a surface mounting type package such as a gate array called ASIC (Application Specific IC) or a standard cell type LSI. In this case, a cream solder on a substrate is heated by an infrared ray or a fluorocarbon vapor for connection to a lead of a semiconductor device. In the heating step, the entire package is exposed to such a high temperature as about 215° to 260° C. The rapid heating tends to cause crack occurrence in the package. To be more specific, since the resin which has absorbed moisture is exposed to a high temperature, the water within the package is evaporated, leading to swelling of the package. Further, the stress accompanying the swelling causes the resin to be cracked. Where the cracking reaches the outer surface of the resin (package), the reliability in terms of resistance to humidity is markedly impaired. What should also be noted is that the resin itself is also swollen, making it impossible to achieve the mounting. Still further, cracking also occurs in a PSG (phosphosilicate glass) layer or a SiN (silicon nitride) layer used as a passivation film on a wiring layer of aluminum. Alternatively, a gold bonding wire tends to be broken in some cases.

As described above, the reliability of the device is markedly lowered by the crack occurrence. Presently, how to prevent the crack occurrence is a serious problem to be solved in the surface mounting process.

As a measure for solving the problem, demands are being raised for further improving the properties of the encapsulating resin. Particularly, when it comes to a resin encapsulation type semiconductor device of a large package, it is demanded that the stress imparted by the encapsulating resin to the encapsulated material be diminished, and that the bonding strength be increased between the encapsulating resin and the PSG, SiN, and polyimide films on the surface of the semiconductor element and between the encapsulating resin and the lead frame. It is also demanded that the encapsulating resin be imparted with sufficient strength and humidity resistance under high temperatures to which the package is exposed in the mounting step, and that the water vapor absorption amount of the encapsulating resin be diminished.

In view of these demands, a resin composition containing a polyfunctional epoxy resin having a heat-resistant skeletal structure and/or a polyfunctional phenolic resin curing agent is proposed recently as an encapsulating resin having a strength high enough to withstand the water vapor generated within the package. However, the semiconductor device encapsulated with such a heat-resistant encapsulating resin (composition) is unsatisfactory in reliability in terms of humidity resistance and in resistance to external contamination, compared with the device encapsulated with a novolak type epoxy resin composition. Also, the above heat-resistant encapsulating resin is poor in mold release characteristics. It is certainly possible to improve the mold release characteristics by adding a sufficient amount of a mold release agent. In this case, however, the bonding strength is lowered between the cured resin and the semiconductor element and between the cured resin and the lead frame. It follows that, in the resin encapsulation type semiconductor device using the above encapsulating resin, the package tends to be cracked in the mounting step, leading to deterioration in the reliability in terms of humidity resistance.

SUMMARY OF THE INVENTION

An object of the present invention is to provide a resin encapsulation type semiconductor device using an encapsulating resin excellent in heat-resistance, reliability in terms of humidity resistance, and resistance to an external contamination.

Another object is to provide a resin encapsulation type semiconductor device without generating the package cracking and excellent in reliability in terms of humidity resistance, using as an encapsulating resin an epoxy resin composition with improved mold release characteristics and heat resistance.

According to a first embodiment of the present invention, there is provided a resin encapsulation type semiconductor device, comprising a semiconductor element and an epoxy resin composition used as an encapsulating resin, said composition containing as essential components:

(a) an epoxy resin represented by formula (I) given below:

where $R^1$, $R^2$, $R^3$, and $R^4$ are hydrogen or alkyl group respectively, and $n \geq 0$, (b) a phenolic resin curing agent,

(c) an imidazole compound, and (d) triphenyl phosphate or a derivative thereof.

The above epoxy resin composition used as the encapsulating resin permits improving various properties of the resin encapsulation type semiconductor device of the present invention. Specifically, a heat-resistant skeletal structure is formed in the cured encapsulating resin by the epoxy resin (a) and the phenolic resin curing agent (b) contained in composition, leading to an improved heat resistance. The combination of the imidazole compound (c) used as a curing catalyst and triphenyl phosphate or a derivative thereof (d) permits improving the package crack resistance and the resistance to the external contamination. Further, the combination of the components (c) and (d) permits ensuring the reliability of the cured resin in terms of the humidity resistance. It follows that the resin encapsulation type semiconductor device according to the first embodiment of the present invention exhibits a high reliability in various properties in the surface mounting step and under various environments after the surface mounting step. In other words, the present invention provides a semiconductor device adapted for a package of a surface mounting type.

According to a second embodiment of the present invention, there is provided a resin encapsulation type semiconductor device, comprising a semiconductor element and an epoxy resin composition used as an encapsulating resin, said composition containing as essential components:

(a) an epoxy resin represented by formula (I) given below:

where $R^1$, $R^2$, $R^3$, and $R^4$ are hydrogen or alkyl group respectively, and $n \geq 0$, (b) a phenolic resin curing agent, and (e) a mold release agent of a three-component system consisting essentially of an ester-based wax, an oxidized paraffin wax and an olefin-based wax.

In the second embodiment of the present invention, the mold release agent (e) contained in the encapsulating resin permits improving the mold release characteristics of the cured resin from the mold. In addition, the heat resistance of the cured resin is also improved by the presence of the epoxy resin (a) and the phenolic resin curing agent (b), as already pointed out in conjunction with the first embodiment. It follows that a high speed automatic molding machine can be used for stably manufacturing the device of the second embodiment. In addition, a high heat resistance and a high package crack resistance can be ensured in the mounting step.

Also, the device is excellent in its reliability in terms of humidity resistance after the mounting step. It follows that the semiconductor device according to the second embodiment is adapted for a large package of a surface mounting type.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The resin encapsulation type semiconductor device according to any of the first and second embodiments of the present invention can be manufactured by, for example, encapsulating a semiconductor element assembled by using a lead frame with an encapsulating resin by the ordinary method. The device of the first embodiment is equal in construction to the device of the second embodiment.

Figure 1:
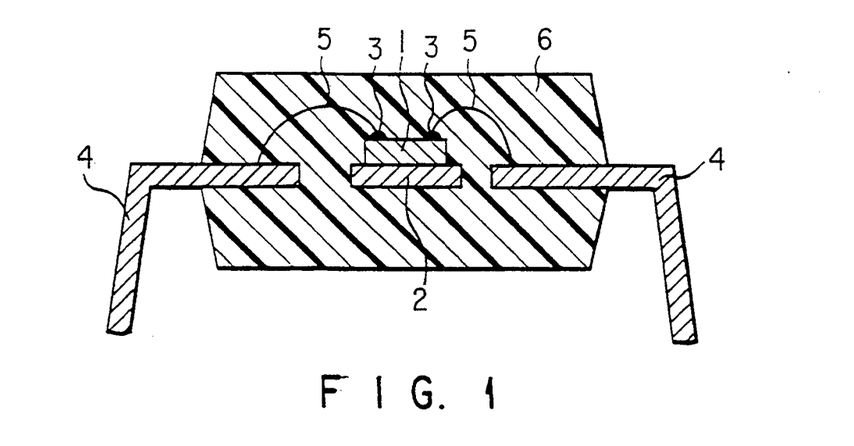
FIG. 1 is a cross sectional view exemplifying the construction of a resin encapsulation type semiconductor device of the present invention.

FIG. 1 exemplifies a cross section of a resin encapsulation type semiconductor device of the present invention. As shown in FIG. 1, a semiconductor chip 1 is mounted on an island 2. A plurality of bonding pads 3 are formed on the main surface of the semiconductor chip 1. These pads 3 are connected to a lead frame 4 via bonding wires 5. The structure of the particular construction Is encapsulated with resin 6 to provide a resin encapsulation type semiconductor device.

In the first embodiment of the present invention, the encapsulating resin 6 is formed of an epoxy resin composition containing as essential components (a) an epoxy resin, (b) a phenolic resin curing agent, (c) an imidazole compound, and (d) triphenyl phosphate or a derivative thereof, as described previously. In the second embodiment, the encapsulating resin 6 is formed of an epoxy resin composition containing as essential components (a) an epoxy resin, (b) a phenolic resin curing agent, and (e) a mold release agent of three component system consisting of an ester-based wax, an oxidized paraffin wax, and an olefin-based wax.

A low pressure transfer molding is the most general method employed in the present invention for the resin encapsulation, though it is also possible to employ an injection molding, compression molding, casting, etc. The epoxy resin composition is heated in the encapsulating step to cure the composition regardless of the kind of the encapsulating method employed. As a result, obtained is a semiconductor device having the semiconductor element encapsulated with the cured resin. For curing the composition, it is desirable to apply an after-curing treatment by the heating to at least about 160° C.

The semiconductor element is not particularly restricted in the present invention. Also, the type of package to be formed is not particularly restricted. Further, packages such as DIP and ZIP can be formed in the present invention in addition to the package of a surface mounting type.

The epoxy resin composition used as an encapsulating resin in the first embodiment of the present invention comprises an epoxy resin (a) represented by formula (I), i.e., a polyfunctional epoxy resin having a high resistance to heat. The epoxy resin (a) can be synthesized by, for example, epoxidizing a condensate between alkyl phenols and hydroxybenzaldehydes. The known method for synthesizing a novolak resin can be employed for manufacturing the epoxy resin (a). Specifically, in the first step, alkyl phenols and hydroxybenzaldehydes are condensed at about 30° to 180° C. in the presence of an inorganic acid such as hydrochloric acid or sulfuric acid, an organic acid such as acetic acid, p-toluene sulfonic acid or thioglycolic acid, or an acidic catalyst such as Lewis acid. Then, the resultant condensate is reacted with epichlorhydrin in the presence of an alkali metal hydroxide such as caustic soda (i.e., NaOH) to epoxidize the condensate.

It is desirable for the chlorine content of the epoxy resin to be not higher than 1,000 ppm for ensuring the reliability of the resin. Also, an epoxy resin represented by formula (II) given below is produced by the reaction between some molecules of the epoxy resin of formula (I):

where $R^1$, $R^2$, $R^3$, and $R^4$ are hydrogen or alkyl group respectively, and $n \geq 0$.

It follows that it is acceptable for epoxy resin (a) used in the present invention to contain the epoxy resin represented by formula (II). However, if the epoxy resin of formula (II) is contained in an unduly large amount, various properties of the epoxy resin composition tend to be degraded. Naturally, the content of the epoxy resin of formula (II) in the epoxy resin (a) should desirably be low, e.g., about 20 or less % by weight.

The epoxy resin represented by formula (I) includes, for example:

ESX-221 (trade name of epoxy resin manufactured by Sumitomo Chemical Co., Ltd., softening point: 85° C.; epoxy equivalent: 213);

YL-6080 (trade name of epoxy resin manufactured by Yuka Shell Epoxy K.K., softening point: 90° C.; epoxy equivalent: 200); and YL-6217 (trade name of epoxy resin manufactured by Yuka Shell Epoxy K.K., softening point: 90° C.; epoxy equivalent: 210).

An additional epoxy resin other than the epoxy resin of formula (I) can be used together with the epoxy resin of formula (I) in preparing the epoxy resin composition used in the present invention. The additional epoxy resin, which is not particularly restricted as far as at least two epoxy groups are included in a single molecule, can be used appropriately in a manner not to impair the function and effect of the present invention. The particular epoxy resin includes, for example, a phenolic novolak type epoxy resin, a cresol novolak type epoxy resin, a naphthol novolak type epoxy resin, a bisphenol A novolak type epoxy resin, a glycidyl ether of bisphenol A, an epoxide of tetra(hydroxyphenyl)alkane, bishydroxybiphenyl type epoxy resin, and various kinds of brominated epoxy resins. These additional epoxy resins can be used singly or in combination in the present invention.

The epoxy resin composition used in the first embodiment of the present invention also contains a phenolic resin curing agent (b) as a component acting as a curing agent of the encapsulating resin. It is particularly desirable to use a phenolic resin represented by formula (III) given below as the phenolic resin curing agent:

where $R^5$ and $R^6$, which may be the same or different, are hydrogen or alkyl group having 1 to 20 carbon atoms, and $R^7$ is a single bond or an alkylene group such as methylene or ethylene.

The phenolic resin represented by formula (III) is a condensate obtained by the condensation reaction between, for example, phenols or aklyl phenols and hydroxybenzaldehydes. The specific compounds used as the phenolic resin In the present invention include, for example, tris(hydroxyphenyl)methane, tris(hydroxymethylphenyl)methane, tris(hydroxyphenyl)propane, and tris(hydroxyphenyl)methylmethane. These compounds can be used singly or in combination in the present invention as a phenolic resin. In order to ensure reliability of the phenolic resin, it is desirable for unreacted phenol monomers to be contained in the resin in an amount of at most 1% by weight.

The specific phenolic resins used in the present invention include, for example:

YL-6065 (trade name of a phenolic resin manufactured by Yuka Shell Epoxy K.K., softening point: 110° C.; hydroxyl equivalent: 98);

YL-6100 (trade name of a phenolic resin manufactured by Yuka Shell Epoxy K.K., softening point: 107° C.; hydroxyl equivalent: 110);

OTM-486 (trade name of a phenolic resin manufactured by Showa High Polymer Co., Ltd., softening point: 120° C.; hydroxyl equivalent: 98);

OTM-488 (trade name of a phenolic resin manufactured by Showa Kobunshi K.K., softening point: 125° C.; hydroxyl equivalent: 98);

OTM-489 (trade name of a phenolic resin manufactured by Showa High Polymer Co., Ltd., softening point: 123° C.; hydroxyl equivalent: 98); and PC-7004 (trade name of a phenolic resin manufactured by Sumitomo Chemical Co., Ltd, softening point: 140° C.; hydroxyl equivalent: 129).

Additional phenolic resins other than those represented by formula (III) can also be used in the present invention together with the phenolic resin represented by formula (III) in a manner not to impair the function and effect produced by the phenolic resin curing agent (b). These additional phenolic resins are not particularly restricted as far as at least two phenolic hydroxyl groups are included in a single molecule. Specific examples of the additional phenolic resins include a phenolic novolak resin, a cresol novolak resin, a naphthol novolak resin, a bisphenol A novolak resin, a phenol aralkyl resin and a terpene phenol resin.

In the epoxy resin composition used in the first embodiment of the present invention, it is important to determine appropriately the mixing ratio of the phenolic resin curing agent (b) and the epoxy resin (a). Specifically, it is desirable to set the mixing ratio of the number of phenolic hydroxyl groups of the phenolic resin to the number of epoxy groups of the epoxy resin, i.e., the number of phenolic hydroxyl groups/the number of epoxy groups, to fall within a range of between about 0.5 and 1.5. If the mixing ratio is less than 0.5, the curing reaction tends to fail to take place sufficiently, with the result that the cured encapsulating resin fails to exhibit a sufficiently high mechanical strength in some cases. On the other hand, if the mixing ratio exceeds 1.5, the cured encapsulating resin tends to be degraded in properties, particularly in resistance to humidity.

The imidazole compound (c) contained in the epoxy resin composition used in the first embodiment of the present invention acts as a curing catalyst of the encapsulating resin and, at the same time, serves to improve the resistance to the external contamination. Specific imidazole compound (c) includes, for example, imidazole, 2-methylimidazole, 2-ethylimidazole, 1,2-dimethylimidazole, 2,4-dimethylimidazole, 2-ethyl-4-methylimidazole, 2-phenylimidazole, 2-phenyl-4-methylimidazole, 2-undecylimidazole, 2-heptadecylimidazole, 1-cyanoethyl-2-ethyl-4-methylimidazole, 2-phenyl-4,5-dihydroxymethylimidazole, and 1-vinyl-2-methylimidazole. In order to ensure the reliability of the encapsulating resin in terms of the humidity resistance, it is desirable to use an imidazole compound having a long-chain alkyl group having at least 11 carbon atoms or a phenyl group bonded at the 2-position and a hydrogen atom or a methyl group bonded at the 4-position.

The specific compounds used as the imidazole compound (c) differ from each other in the catalytic activity, making it difficult to determine accurately the mixing amount of the imidazole compound (c) in the epoxy resin composition used in the present invention. However, the mixing amount of the imidazole compound (c) should desirably fall in general within a range of between 0.1 to 5% by weight based on the total amount of the resin components comprising the epoxy resin (a) and the phenolic resin curing agent (b). If the mixing amount of the imidazole compound (c) is smaller than 0.1% by weight, the curing characteristics tend to be deteriorated, leading to reduction in the heat resistance of the semiconductor device. If the mixing amount exceeds 5% by weight, however, the reliability in terms of the humidity resistance of the semiconductor device tends to be lowered.

It is possible for the epoxy resin composition used in the first embodiment of the present invention to contain traces of additional curing catalysts together with the imidazole compound (c) described above in a manner not to impair the effect produced by the imidazole compound (c). The additional curing catalysts noted above include, for example, amine series compounds, diazabicyclo alkenes and salts thereof, organophosphines and organometallic compounds.

The specific amine series compounds which can be used in the present invention include, for example triethylamine, diethylenetriamine, triethylenetetramine, diethylaminopropylamine, N-aminoethylpyradine, bis(4-amino-3-methylcyclohexane)methane, metaxylyleneamine, methanediamine, and 3,9-bis(3-aminopropyl)-2,4,8,10-tetraoxospiro [5,5] undecane.

The diazabicyclo alkenes and salts thereof, which can be used in the present invention, include, for example, 1,8-diazabicyclo [5,4,0] undeca-7-ene and salt thereof. Further, the organophosphines used in the present invention include, for example, triphenylphosphine, tricyclohexylphosphine, and tris(3,5-dimethylphenyl)phosphine.

The epoxy resin composition used in the first embodiment of the present invention further contains triphenyl phosphate or a derivative thereof (d). Triphenyl phosphate is a compound whose chemical structure is $(C_6H_5O)_3P=O$, and the derivative of triphenyl phosphate means a compound in which a lower alkyl group is introduced into at least one of the benzene rings of triphenyl phosphate. The derivative includes, for example, tricresyl phosphate $(CH_3C_6H_4O)_3P=O$. The component (d) serves to enable the semiconductor device encapsulated with a heat resistant epoxy resin composition to exhibit improved resistances to cracking and to humidity. The mixing amount of triphenyl phosphate (d) should fall within a range of between 0.1 and 5% by weight based on the total amount of the resin components of the composition. If the mixing amount of triphenyl phosphate (d) is smaller than 0.1% by weight, the epoxy resin composition tends to fail to exhibit sufficiently high resistance to humidity. On the other hand, if the mixing amount is larger than 5% by weight, the curing characteristics of the resin composition tend to be lowered.

In addition to the essential components described above, inorganic fillers should desirably be added to the epoxy resin composition used in the first embodiment of the present invention. The inorganic fillers used in the present invention include, for example, crushed or ground materials, spherical powders, fibrous materials, whiskers and microbaloons of quartz, fused silica, titanium oxide, silicon nitride, aluminum nitride, talc, alumina, hydrated alumina, glass, antimony oxide, boron nitride, calcium silicate, and various ceramics. The mixing amount of these inorganic fillers is not particularly restricted in the present invention. However, it is desirable in general that the mixing amount of the inorganic fillers fall within a range of between 40 and 75% by volume based on the total amount of the encapsulating resin. If the mixing amount is smaller than 40% by volume, the thermal expansion coefficient of the encapsulating resin tends to become unduly large, leading to reduction in the thermal shock resistance. If the mixing amount of the inorganic filler is larger than 75% by volume, however, the fluidity of the composition is lowered, with the result that the moldability of the epoxy resin composition tends to be deteriorated.

It is also possible to add a halogenated epoxy resin acting as a flame-retardant to the epoxy resin composition used in the first embodiment of the present invention. The halogenated epoxy resin used in the present invention is not particularly restricted as far as the resin contains halogen atoms such as bromine or chlorine atoms and at least two epoxy groups in a single resin molecule. For example, it is possible to use a bromide of a bisphenol type epoxy resin or a bromide of a novolak type epoxy resin. Preferably, used in the present invention is a brominated bisphenol type epoxy resin or a brominated novolak type epoxy resin each having a bromine content of at least 20% by weight. It is more preferable to use a brominated bisphenol type epoxy resin having a bromine content of at least 40% by weight. The specific examples of the halogenated epoxy resin used in the present invention include:

AER-735 (trade name of a halogenated epoxy resin manufactured by Asahi Chemical Co., Ltd., bromine content: 48% by weight; epoxy equivalent: 350; softening point: 60° C.; semi-solid; bisphenol type);

AER-745 (trade name of a halogenated epoxy resin manufactured by Asahi Chemical Co., Ltd., bromine content: 48% by weight; epoxy equivalent: 400; softening point: 71° C.; bisphenol type);

AER-755 (trade name of a halogenated epoxy resin manufactured by Asahi Chemical Co., Ltd., bromine content: 48% by weight; epoxy equivalent: 460; softening point: 81° C.; bisphenol type);

AER-765 (trade name of a halogenated epoxy resin manufactured by Asahi Chemical Co., Ltd., bromine content: 50% by weight; epoxy equivalent: 602; softening point: 101° C.; bisphenol type);

BRENS (trade name of a halogenated epoxy resin manufactured by Nihon Kayaku Co., Ltd., bromine content: 36% by weight; epoxy equivalent: 289; softening point: 88° C.; phenolic novolak type);

Brominated EPPN 500 (trade name of a halogenated epoxy resin manufactured by Nihon Kayaku Co., Ltd., bromine content: 44% by weight; epoxy equivalent: 285; softening point: 94° C.; phenolic novolak type);

AER-711 (trade name of a halogenated epoxy resin manufactured by Asahi Kasei Kogyo K.K., bromine content: 20% by weight; epoxy equivalent: 480; softening point: 74° C.; bisphenol type);

Epiclon 152 (trade name of a halogenated epoxy resin manufactured by Dai-Nippon Ink and Chemicals, Inc., bromine content: 46% by weight; epoxy equivalent: 360; softening point: 55° C.; phenolic novolak type); and Epiclon 1120 (trade name of a halogenated epoxy resin manufactured by Dai-Nippon Ink and Chemicals, Inc., bromine content: 20% by weight; epoxy equivalent: 480; softening point: 75° C.; phenolic novolak type).

Further, it is possible for the epoxy resin composition used in the first embodiment of the present invention to contain, as desired, suitable amounts of still additional components other than those described above, said additional components including, for example, flame-retardant assistants such as an antimony compound and a phosphorus compound; mold release agents such as natural waxes, synthetic waxes, linear fatty acids and metal salts thereof, acid amides, esters and paraffins; coloring agents such as carbon black, titanium dioxide and a dye; surface treating agents of fillers such as silane coupling agents and titanium coupling agents; and stress-reducing agents such as silicone oil, silicone rubber, various powdery plastic materials, various powdery engineering plastic materials, and powdery ABS resin and MBS resin.

The epoxy resin composition used in the first embodiment of the present invention can be prepared without difficulty by employing, for example, melt kneading using a heating roll, an extruder, or a kneader, grinding, or mixing of the components with a special mixer after kneading and grinding. Of course, some of these techniques can be employed in combination for preparing the epoxy resin composition used in the present invention.

An epoxy resin composition is also used as an encapsulating resin in the resin encapsulated semiconductor device according to the second embodiment of the present invention. The epoxy resin composition used in the second embodiment also contains the epoxy resin (a) and the phenolic resin curing agent (b), which were already described in conjunction with the first embodiment of the present invention. The additional epoxy resin, which can be used together with epoxy resin (a) represented by formula (I) in the first embodiment, can also be used in the second embodiment. Further, the mixing amounts of the epoxy resin and the phenolic resin curing agent (b) described previously in conjunction with the first embodiment should also be employed in the second embodiment of the present invention.

The epoxy resin composition used in the resin encapsulated semiconductor device according to the second embodiment of the present invention is featured in that the composition contains a mold release agent (e) of three component system consisting essentially of an ester-based wax, an oxidized paraffin wax, and an olefin-based wax.

To be more specific, the ester-based wax contained in the mold release agent (e) should desirebly be is an ester obtained by the reaction between a monovalent higher fatty acid and a monovalent higher alcohol and, includes, for example, carnauba wax manufactured by Soekawa Rikagaku K.K., which is an ester of cerotic acid and myricyl alcohol, said ester having a melting point of 87° C., an acid value of 2 to 6, and a saponification value of 83, and Hoechst E (trade name) manufactured by Hoechst Japan Limited, which is a wax having a melting point of 76° to 82° C., an acid value of 15 to 20, and a saponification value of 125 to 155. Needless to say, the ester-based wax used in the present invention is not restricted to carnauba wax and Hoechst E exemplified above.

The oxidized paraffin wax contained in the mold release agent (e) is an oxide of hydrocarbons, and preferably, is a mixture of higher alcohols, higher fatty acids and esters obtained by oxidizing hydrocarbons. The oxidized paraffin wax includes, for example, LUVAX-0321 (trade name of an oxidized paraffin wax manufactured by Nippon Seiro K.K., having a melting point of 75° C., a molecular weight of about 800, an acid value of 12, a saponification value of 30, and a hydroxyl value of 80), and Hoechst S (trade name of an oxidized paraffin wax manufactured by Hoechst Japan Limited, having a melting point 78° to 84° C., an acid value 135 to 155, and a saponification value of 155 to 175). Of course, the oxidized paraffin wax used in the present invention need not be restricted to LUVAX-0321 and Hoechst S.

Further, the olefin-based wax contained in the mold release agent (e) should desirably be provided by a low molecular weight polyethylene and a low molecular weight polypropylene, each having a molecular weight of 500 to 5,000. It is particularly desirable to use a low molecular weight polyethylene or polypropylene modified by oxidation or acid-modified by an acid anhydride. Specific examples of the olefin-based wax used in the present invention are:

(1) Oxidation Type Polyethylene Wax

HW-4252E (trade name of an oxidation type polyethylene wax manufactured by Mitsui Petrochemical Industries, Ltd., having a melting point of 93° C., a molecular weight of about 3,000, and an acid value of 17);

HW-4202E (trade name of an oxidation type polyethylene wax manufactured by Mitsui Petrochemical Industries, Ltd., having a melting point of 101° C., a molecular weight of about 2,500, and an acid value of 17);

HW-4052E (trade name of an oxidation type polyethylene wax manufactured by Mitsui Petrochemical Industries, Ltd., having a melting point of 110° C., a molecular weight of about 3,200, and an acid value of 20);

E-300 (trade name of an oxidation type polyethylene wax manufactured by Sanyo Kasei Industries, having a melting point of 104° C., a molecular weight of about 3,000, and an acid value of 22);

E-250P (trade name of an oxidation type polyethylene wax manufactured by Sanyo Kasei Industries, having a melting point of 104° C., a molecular weight of about 2,000, and an acid value of 22.);

PAD-521 (trade name of an oxidation type polyethylene wax manufactured by Hoechst Japan Limited, having a melting point of 104° C., a molecular weight of about 2,000, and an acid value of 16); and PAD-522 (trade name of an oxidation type polyethylene wax manufactured by Hoechst Japan Limited, having a melting point of 104° C., a molecular weight of about 3,000, and an acid value of 25).

(2) Oxidation Type Polypropylene Wax

TS-200 (trade name of an oxidation type polypropylene wax manufactured by Sanyo Kasei Industries, having a melting point of 145° C., a molecular weight of about 3,500, and an acid value of 3.5).

(3) Acid-Modified Type Polyethylene Wax

HW-1105A (trade name of an acid-denatured type polyethylene wax manufactured by Mitsui Petrochemical Industries, Ltd., having a melting point of 104° C., a molecular weight of about 1,500, and an acid value of 60).

In the epoxy resin composition used in the second embodiment of the present invention, the mixing amount of the mold release agent (e) should desirably fall within a range of between 0.3 and 0.8% by weight in the total amount of the epoxy resin composition and within a range of between 1.5 and 4.5% by weight based on the total amount of the epoxy resin and the curing agent. If the mixing amount of the mold release agent is smaller than the lower limits of the ranges noted above, it is difficult to obtain satisfactory mold release characteristics in some cases. On the other hand, where the upper limits of the ranges noted above are exceeded, the mold tends to be stained after the molding step. Also, the bonding strength between the encapsulating resin and the semiconductor element and between the encapsulating resin and the lead frame tends to be lowered, resulting in a low reliability of the resin encapsulation type semiconductor device in terms of the humidity resistance.

Figure 2:
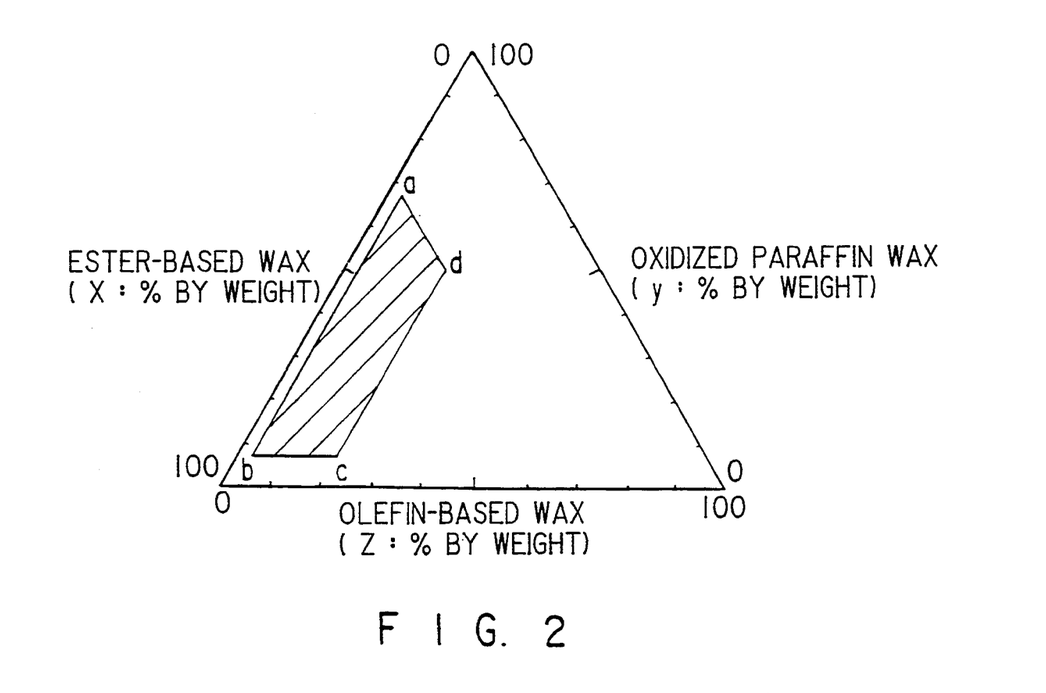
FIG. 2 is a triangular coordinate showing a preferred range of mixing ratio of three components constituting a mold release agent used in the present invention.

FIG. 2 a triangular coordinate (i.e., triangular graph) showing a desirable mixing ratio of the three components of the mold release agent (e). As shown in FIG. 2, the mixing amounts of the three components of the mold release agent (e) should fall within a range defined by points a, b, c, d given below:

a: $x=30$, $y=67$, $z=3$
b: $x=92$, $y=5$, $z=3$
c: $x=75$, $y=5$, $z=20$
d: $x=30$, $y=50$, $z=20$ where, x denotes the ester-based wax (% by weight), y denotes the oxidized paraffin wax (% by weight), and z denotes the olefin-based wax (% by weight).

If the mixing ratio of the three components is positioned outside the line a-b and outside the line b-c shown in FIG. 2, it is impossible to obtain a sufficient effect of improving the mold release characteristics of the resin encapsulated semiconductor device after curing of the encapsulating resin in some cases. On the other hand, if the mixing ratio of the three components is positioned outside the line c-d and outside the line d-a shown in FIG. 2, it is difficult to obtain a sufficient package crack resistance in some cases.

In the resin encapsulation type semiconductor device according to the second embodiment of the present invention, the epoxy resin composition may further contain curing catalysts such as imidazole compounds, amine series compounds, diazabicyclo alkenes and salts thereof, organophosphines and organometallic compounds as in the first embodiment described previously, in addition to the essential components described above.

The specific compounds used as the curing catalysts in the epoxy resin composition in the second embodiment of the present invention differ from each other in the catalytic activity, making it difficult to determine accurately the mixing amount of the curing catalysts. However, the mixing amount of the curing promotor should desirably fall in general within a range of between 0.1 and 5% by weight based on the total amount of the resin components comprising the epoxy resin (a) and the phenolic resin curing agent (b). If the mixing amount of the curing catalyst is smaller than 0.1% by weight, the curing characteristics tend to be deteriorated, leading to reduction in the heat resistance of the semiconductor device. If the mixing amount exceeds 5% by weight, however, the reliability in terms of the humidity resistance of the semiconductor device tends to be lowered.

Further, the epoxy resin composition used in the second embodiment of the present invention may contain as desired additional addives including inorganic fillers, flame-retardants such as a halogenated epoxy resin, flame-retardant assistants, coloring agents, surface treating agents and stress reducing agents as in the epoxy resin composition used in the first embodiment described previously. The amounts of these additives should be equal to those described previously in conjunction with the first embodiment of the present invention.

Still further, the epoxy resin composition used in the second embodiment of the present invention can be prepared without difficulty by employing, for example, melt kneading using a heating roll, an extruder, or a kneader, grinding, or mixing of the components with a special mixer after kneading and grinding, as in the first embodiment described previously. Of course, some of these techniques can be employed in combination for preparing the epoxy resin composition used in the present invention.

Let us describe more in detail the present invention with reference to Examples which follow. The following Examples are intended to facilitate the understanding of the present invention and do not restrict the technical scope of the present invention.

EXAMPLES 1 TO 3 AND COMPARATIVE EXAMPLES 1 TO 3

Epoxy resin compositions were prepared by mixing the components shown in Table 1 as follows. In the first step, a filler was treated with a surface treating agent within a Henschel mixer, followed by mixing the other components of the composition and, then, kneading the mixture at 60° to 130° C. by using a heating roll. The kneaded mixture was then cooled and ground so as to obtain a desired epoxy resin composition.

Epoxy resin C: AER-755 (trade name of bisphenol A type brominated epoxy resin manufactured by Asahi Chemical Industry Co., Ltd., having an epoxy equivalent of 460, a softening point of 81° C., and bromine content of 48% by weight)

Phenolic resin A (curing agent): YL-6065 (trade name of a tris(hydroxyphenyl)methane-based phenolic resin manufactured by Yuka Shell Epoxy K.K., having a hydroxyl equivalent of 98 and a softening point of 121° C.)

Phenolic resin B (curing agent): BRG-557 (trade name of a phenolic novolak resin manufactured by Showa High Polymer Co., Ltd., having a hydroxyl equivalent of 104 and a softening point of 85° C.)

Curing catalyst A: $C_{17}Z$ (trade name of 2-heptadecyl imidazole manufactured by Shikoku Kasei K.K.)

Curing catalyst B: 2MZ (trade name of 2-methylimidazole manufactured by Shikoku Kasei K.K.)

Curing catalyst C: PP-360 (trade name of triphenylphosphine manufactured by KI Chemical Industry Co., Ltd.)

Mold release agent A: Carnauba No. 1 (trade name of carnauba wax manufactured by Arakawa Rinsankagaku K.K.)

Pigment (coloring agent): CB#30 (trade name of a carbon black manufactured by Mitsubishi Kasei Cooperation)

Flame-retardant assistant: antimony trioxide manufactured by Mikuni Seiren K.K.

Filler: fused silica powder manufactured by Toshiba Ceramics Co., Ltd., having a crushed or ground state and an average particle size of 20 microns.

TABLE 1

|  | Example 1 | Example 2 | Example 3 | Comparative Example 1 | Comparative Example 2 | Comparative Example 3 |
| --- | --- | --- | --- | --- | --- | --- |
| Epoxy resin |  |  |  |  |  |  |
| A | 12.9 | 12.8 | 12.8 | 12.9 | 12.9 | — |
| B | — | — | — | — | — | 12.5 |
| C | 2.5 | 2.5 | 2.5 | 2.5 | 2.5 | 2.5 |
| Phenolic resin (Curing agnet) |  |  |  |  |  |  |
| A | 6.2 | 3.1 | 3.1 | 6.2 | 6.2 | 6.5 |
| B | — | 3.1 | 3.1 | — | — | — |
| Curing catalyst |  |  |  |  |  |  |
| A | 0.2 | 0.2 | — | 0.2 | — | 0.2 |
| B | — | — | 0.1 | — | — | — |
| C | — | — | — | — | 0.1 | — |
| Mold release agent |  |  |  |  |  |  |
| A | 0.5 | 0.5 | 0.5 | 0.5 | 0.5 | 0.5 |
| Pigment | 0.4 | 0.4 | 0.4 | 0.4 | 0.4 | 0.4 |
| Flame-reterdant assistant | 2.0 | 2.0 | 2.0 | 2.0 | 2.0 | 2.0 |
| Filler | 75.0 | 75.0 | 75.0 | 75.0 | 75.0 | 75.0 |
| Surface treating agnet | 0.3 | 0.3 | 0.3 | 0.3 | 0.3 | 0.3 |
| Triphenyl phosphate | 0.1 | 0.1 | 0.1 | — | 0.1 | 0.1 |

*Numerals denote parts by weight

The components of the epoxy resin compositions shown in Table 1 are as follows:

Epoxy resin A: ESX-221 (trade name of tris (hydroxy alkylphenyl)-based epoxy resin manufactured by Sumitomo Chemical Co., Ltd., having an epoxy equivalent of 213 and a softening point of 85° C.)

Epoxy resin B: ESCN195XL (trade name of ortho-cresol novolak epoxy resin manufactured by Sumitomo Chemical Co., Ltd., having an epoxy equivalent of 197 and a softening point of 75° C.)

Surface treating agent (coupling agent): A-187 (trade name of y-glycidoxypropyl trimethoxy silane manufactured by Nippon Unicar Co., Ltd.)

It should be noted that triphenyl phosphate is not contained in the epoxy resin composition for Comparative Example 1. In the epoxy resin composition for Comparative Example 2, triphenylphosphine alone is used as a curing catalyst. Further, an epoxy resin of the chemical structure denoted by formula (I) is not contained in the composition for Comparative Example 3.

A resin encapsulation type semiconductor device (semiconductor package) was manufactured by the ordinary method by using each of the epoxy resin compositions shown in Table 1, followed by applying evaluation tests (1) and (2) described below to each of the semiconductor packages.

1) Test for Evaluating the Humidity Resistance Reliability

A test piece device was encapsulated with each of the epoxy resin compositions, followed by applying an aftercure treatment at 180° C. for 4 hours. Then, the resultant package was left to stand under an atmosphere having a temperature of 85° C. and a relative humidity of 85% so as to allow the package to absorb moisture, followed by exposing the package to a fluorocarbon vapor of 215° C. for one minute. The crack occurrence of the package was examined after exposure of the package to the fluorocarbon vapor.

Besides, the package was subjected to a pressure cooker test, in which the package was left to stand for a predetermined time under a saturated steam atmosphere of 127° C. to examine the occurrence of defectiveness (defectiveness derived from current leakage and disconnection).

2) Test for Evaluating Resistance to External Contamination

A test piece device was encapsulated with each of the epoxy resin compositions, followed by applying an aftercure treatment at 180° C. for 4 hours. Then, the resultant package was dipped in a 5% aqueous solution of sodium chloride, followed by leaving the package to stand for a predetermined time under an atmosphere having a temperature of 85° C. and a relative humidity of 85% so as to examine the occurrence of defectiveness (defectiveness derived from current leakage and disconnection).

Table 2 shows the results of these tests.

TABLE 2

| | | Examples | | | Comparative Examples | | |
|---|---|---|---|---|---|---|---|
| | | 1 | 2 | 3 | 1 | 2 | 3 |
| Cracking occurrence after moisture absorption and high temp. treatment(a) + Defect occurrence after pressure cooker test(b) (defective samples/all samples tested) | (a)Cracking (b)100 hours*1 200 hours 300 hours 400 hours 500 hours | 0/20 0/20 0/20 0/20 0/20 0/20 | 0/20 0/20 0/20 0/20 0/20 0/20 | 0/20 0/20 0/20 0/20 0/20 5/20 | 10/20 0/20 20/20 — — — | 20/20 0/20 5/20 20/20 — — | 20/20 0/20 10/20 20/20 — — |
| Defect occurrence in constant temp. — humidity test after dipping in saline solution(c) (defective samples/all samples tested) | (c)200 hours*2 400 hours 600 hours 800 hours 1000 hours | 0/20 0/20 0/20 0/20 2/20 | 0/20 0/20 0/20 0/20 0/20 | 0/20 0/20 0/20 2/20 6/20 | 5/20 20/20 — — — | 0/20 0/20 0/20 0/20 0/20 | 0/20 0/20 0/20 0/20 5/20 |

*1 Time of Pressure Cooker Test.
*2 Time of leaving the package to stand under the predetermined atmosphere.

As apparent from Table 2, the semiconductor device encapsulated with the epoxy resin composition for any of Examples 1 to 3 was found to be superior to the semiconductor device encapsulated with the epoxy resin composition for any of Comparative Examples 1 to 3 in the resistance to cracking under high temperatures and in the humidity resistance reliability determined by the pressure cooker test conducted after the cracking resistance test. It has also been confirmed that the humidity resistance reliability is not impaired even if the epoxy resin composition used in the present invention incurs an external contamination. Particularly, the combination of an imidazole compound and triphenyl phosphate has been found to markedly improve both the humidity resistance reliability and the resistance to external contamination.

EXAMPLES 4 TO 18 AND REFERENCE EXAMPLES 1 TO 4

Epoxy resin compositions were prepared by mixing the components shown in Table 3 as follows. In the first step, a filler was treated with a surface treating agent within a Henschel mixer, followed by mixing the other components of the composition and, then, kneading the mixture at 60° to 130° C. by using a heating roll. The kneaded mixture was then cooled and ground so as to obtain a desired epoxy resin composition.

TABLE 3

| | Example 4 | Example 5 | Example 6 | Example 7 | Example 8 | Example 9 |
|---|---|---|---|---|---|---|
| Mold release agent | | | | | | |
| B | 0.51 | 0.42 | 0.30 | 0.36 | 0.15 | 0.68 |
| C | 0.06 | 0.06 | 0.18 | 0.18 | 0.09 | 0.08 |
| D | 0.03 | 0.12 | 0.12 | 0.06 | 0.06 | 0.04 |
| Epoxy resin | | | | | | |
| A | 12.9 | 12.9 | 12.9 | 12.9 | 12.9 | 12.9 |
| C | 2.5 | 2.5 | 2.5 | 2.5 | 2.5 | 2.5 |
| Phenolic resin (Curing agent) | | | | | | |
| A | 6.2 | 6.2 | 6.2 | 6.2 | 6.2 | 6.2 |
| Curing catalyst | | | | | | |
| A | 0.2 | 0.2 | 0.2 | 0.2 | 0.2 | 0.2 |
| Stress-reducing agent | | | | | | |
| A | 1.0 | 1.0 | 1.0 | 1.0 | 1.0 | 1.0 |
| B | 1.0 | 1.0 | 1.0 | 1.0 | 1.0 | 1.0 |
| Filler | 73.4 | 73.4 | 73.4 | 73.4 | 73.4 | 73.4 |
| Coloring agent | 0.3 | 0.3 | 0.3 | 0.3 | 0.3 | 0.3 |
| Flame-retardant | 2.0 | 2.0 | 2.0 | 2.0 | 2.0 | 2.0 |

TABLE 3-continued

| | | | | | | |
|---|---|---|---|---|---|---|
| Coupling agent | 0.5 | 0.5 | 0.5 | 0.5 | 0.5 | 0.5 |
| Triphenyl phosphate | 0.1 | 0.2 | 0.05 | 0.1 | 0.1 | 0.1 |

| | Example 10 | Example 11 | Example 12 | Example 13 | Example 14 | Example 15 | Example 16 | Example 17 | Example 18 |
|---|---|---|---|---|---|---|---|---|---|
| Mold release agent | | | | | | | | | |
| B | 0.36 | 0.36 | 0.36 | 0.36 | 0.36 | 0.36 | 0.36 | 0.36 | 0.12 |
| C | 0.18 | 0.18 | 0.18 | 0.18 | 0.18 | 0.08 | 0.18 | 0.18 | 0.36 |
| D | 0.06 | — | — | — | 0.06 | 0.06 | 0.06 | 0.06 | 0.12 |
| E | — | 0.06 | — | — | — | — | — | — | — |
| F | — | — | 0.06 | — | — | — | — | — | — |
| G | — | — | — | 0.06 | — | — | — | — | — |
| Epoxy resin | | | | | | | | | |
| A | 12.9 | 12.9 | 12.9 | 12.9 | 8.9 | 12.9 | 12.9 | 12.9 | 12.9 |
| C | 2.5 | 2.5 | 2.5 | 2.5 | 2.5 | 2.5 | 2.5 | 2.5 | 2.5 |
| B | — | — | — | — | 3.8 | — | — | — | — |
| Phenolic resin (Curing agent) | | | | | | | | | |
| A | 6.2 | 6.2 | 6.2 | 6.2 | 6.4 | 3.1 | 3.1 | 6.2 | 6.2 |
| C | — | — | — | — | — | 3.1 | — | — | — |
| D | — | — | — | — | — | — | 3.1 | — | — |
| Curing catalyst | | | | | | | | | |
| A | 0.2 | 0.2 | 0.2 | 0.2 | 0.2 | 0.2 | 0.2 | — | 0.2 |
| B | — | — | — | — | — | — | — | 0.2 | — |
| Stress-reducing agent | | | | | | | | | |
| A | 1.0 | 1.0 | 1.0 | 1.0 | 1.0 | 1.0 | 1.0 | 1.0 | 1.0 |
| B | 1.0 | 1.0 | 1.0 | 1.0 | 1.0 | 1.0 | 1.0 | 1.0 | 1.0 |
| Filler | 73.4 | 73.4 | 73.4 | 73.4 | 73.4 | 73.4 | 73.4 | 73.4 | 73.4 |
| Coloring agent | 0.3 | 0.3 | 0.3 | 0.3 | 0.3 | 0.3 | 0.3 | 0.3 | 0.3 |
| Flame-retardant assistant | 2.0 | 2.0 | 2.0 | 2.0 | 2.0 | 2.0 | 2.0 | 2.0 | 2.0 |
| Coupling agent | 0.5 | 0.5 | 0.5 | 0.5 | 0.5 | 0.5 | 0.5 | 0.5 | 0.5 |
| Triphenyl Phosphate | 0.1 | 0.1 | 0.1 | 0.1 | 0.1 | 0.1 | 0.1 | 0.1 | 0.1 |

| | Reference Example 1 | Reference Example 2 | Reference Example 3 | Reference Example 4 |
|---|---|---|---|---|
| Mold release agent | | | | |
| B | 0.57 | 0.42 | 0.18 | 0.06 |
| C | — | — | 0.42 | 0.54 |
| D | 0.03 | 0.18 | — | — |
| Epoxy resin | | | | |
| A | 12.9 | 12.9 | 12.9 | 12.9 |
| C | 2.5 | 2.5 | 2.5 | 2.5 |
| Phenolic resin (Curing agent) | | | | |
| A | 6.2 | 6.2 | 6.2 | 6.2 |
| Curing catalst | | | | |
| A | 0.2 | 0.2 | 0.2 | 0.2 |
| Stress-reducing agent | | | | |
| A | 1.0 | 1.0 | 1.0 | 1.0 |
| B | 1.0 | 1.0 | 1.0 | 1.0 |
| Filler | 73.4 | 73.4 | 73.4 | 73.4 |
| Coloring agent | 0.3 | 0.3 | 0.3 | 0.3 |
| Flame-retardant assistant | 2.0 | 2.0 | 2.0 | 2.0 |
| Coupling agent | 0.5 | 0.5 | 0.5 | 0.5 |
| Triphenyl phosphate | 0.1 | 0.1 | 0.1 | 0.1 |

*Numerals denote parts by weight

Epoxy resins A, B, C, phenolic resin A, curing promotor A, pigment, flame-retardant assistant, filler, and surface treating agent shown in Table 3 are equal to those shown in Table 1, which were already described in conjunction with Examples 1 to 3. The additional components of the epoxy resin compositions shown in Table 3 are as follows:

Phenolic resin C: YL-6065 (trade name of tris(hydroxyphenyl)methane manufactured by Yuka Shell Epoxy K.K., having a hydroxyl equivalent of 107 and a softening point of 101° C.)

Phenolic resin D: BRG-556 (trade name of a phenolic novolak resin manufactured by Showa High Polymer Co., Ltd., having a softening point of 85° C.)

Stress reducing agent A: BTA-731 (trade name of methyl methacrylate-butadiene-styrene copolymer manufactured by Kureha Chemical Industry Co., Ltd.)

Stress reducing agent B: TSJ-3051 (trade name of an addition thermosetting silicone gel manufactured by Toshiba Silicone Co., Ltd., having a viscosity of 1,000 cP at (25° C.)

Mold release agent B: Carnauba No. 1 (trade name of an ester-based wax manufactured by Soekawa Rikagaku K.K., having a melting point of 87° C., an acid value of 2 to 6, and a saponification value of 83)

Mold release agent C: Calbacks 0321 (trade name of an oxidized paraffin wax manufactured by Nippon Seiro K.K., having a melting point of 75° C., a molecular weight of about 800, an acid value of 12, a saponification value of 30, and a hydroxyl value of 80)

Mold release agent D: HW-4252E (trade name of an oxidation modified polyethylene wax manufactured by Mitsui Petrochemical Industries, Ltd., having a melting point of 93° C., a molecular weight of about 3,000, and an acid value of 17)

Mold release agent E: E-250P (trade name of an oxidation modified polyethylene wax manufactured by Sanyo Chemical Industries Ltd., having a melting point of 104° C., a molecular weight of about 2,000, and an acid value of 20)

Mold release agent F: HW-2203A (trade name of an oxidation modified polyethylene wax manufactured by Mitsui Petrochemical Industries Ltd., having a melting point of 107° C., a molecular weight of about 2,700, and an acid value of 30)

Mold release agent G: TS-200 (trade name of an oxidation modified polyethylene wax manufactured by Sanyo Chemical Industries having a melting point of 145° C., a molecular weight of about 3,500, and an acid value of 3.5)

It should be noted that at least one of mold release agents B, C and D is not contained in the epoxy resin compositions for Reference Examples 1 to 4. On the other hand, all of these mold release agents B, C, D are contained in the epoxy resin composition for Example 8. In this case, however, the mixing ratio of these three mold release agents does not fall within the range a-b-c-d shaded in the triangular coordinate of FIG. 2.

Evaluation tests 3) to 5) were applied as follows to these epoxy resin compositions so as to evaluate the resin encapsulation type semiconductor device manufactured by using these epoxy resin compositions:

3) Bonding Strength with Lead Frame made of 42 Alloy

A molded product of each of the epoxy resin compositions was formed on a surface, having an area of 4 mm², of a lead frame made of 42 alloy, followed by applying an aftercure treatment to the molded body at 175° C. for 8 hours so as to prepare a test piece. Then, each of the test pieces was subjected to a moisture absorption treatment for 168 hours at 85° C. under a relative humidity of 85%. After the moisture absorption treatment, the bonding strength was measured between the resin molded product and the lead frame made of 42 alloy. Table 4 shows the results.

4) Residual Rate of Lead Frame within Mold

A lead frame was encapsulated with each of the epoxy resin compositions by using a low pressure transfer molding machine. The molding temperature was set at 175° C. and the molding was performed for 2 minutes. A similar encapsulating process was performed for 50 shots for each of the resin compositions, followed by releasing the encapsulated lead frame from the mold by the ordinary method so as to measure the residual rate of the lead frame within the mold. Table 4 also shows the results.

5) Crack Occurrence after VPS Treatment

A semiconductor element having a chip size of 15 mm was encapsulated with each of the epoxy resin compositions by using a low pressure transfer molding machine. The molding temperature was set at 175° C. and the molding was performed for 2 minutes. Then, an aftercure treatment was applied to the resin encapsulated semiconductor element at 175° C. for 8 hours so as to manufacture a flat package (i.e., resin encapsulation type semiconductor device) having 184 pins. Further, the resultant flat package was subjected to a moisture absorption treatment at 85° C. under a relative humidity of 60% for 168 hours, followed by applying a vapor phase reflow (VPS) treatment at 215° C. to the package so as to examine the occurrence of defective packages by measuring the crack occurrence reaching the outer surface of the package immediately after the VPS treatment.

Besides, the package was subjected to a humidity resistance reliability test in which the package was left to stand for a predetermined time in a pressure cooker of 121° C. and 2 atm. to examine the occurrence of defectiveness. Table 4 also shows the results.

TABLE 4

| | Example 4 | Example 5 | Example 6 | Example 7 | Example 8 | Example 9 | Example 10 | Example 11 | Example 12 | Example 13 |
|---|---|---|---|---|---|---|---|---|---|---|
| Bonding strength with lead frame (kg/mm²) | 1.5 | 1.4 | 1.0 | 1.2 | 1.9 | 0.8 | 1.3 | 1.4 | 1.2 | 1.2 |
| Lead frame residual rate in mold (%) | 0 | 0 | 0 | 0 | 0 | 0 | 0 | 0 | 0 | 0 |
| Crack occurrence after VPS treatment (cracked samples/all samples tested) | 0/20 | 0/20 | 0/20 | 0/20 | 0/20 | 0/20 | 0/20 | 0/20 | 0/20 | 0/20 |
| Humidity resistance reliability test (defective samples/all samples tested) | | | | | | | | | | |
| 40H | 0/20 | 0/20 | 0/20 | 0/20 | 2/20 | 0/20 | 0/20 | 0/20 | 0/20 | 0/20 |
| 80H | 0/20 | 0/20 | 0/20 | 0/20 | 0/20 | 0/20 | 0/20 | 0/20 | 0/20 | 0/20 |
| 160H | 0/20 | 0/20 | 0/20 | 0/20 | 0/20 | 0/20 | 0/20 | 0/20 | 0/20 | 0/20 |
| 320H | 0/20 | 0/20 | 0/20 | 0/20 | 0/20 | 0/20 | 0/20 | 0/20 | 0/20 | 0/20 |
| 500H | 0/20 | 0/20 | 0/20 | 0/20 | 0/20 | 1/20 | 0/20 | 0/20 | 0/20 | 0/20 |

| | Example 14 | Example 15 | Example 16 | Example 17 | Example 18 | Reference Example 1 | Reference Example 2 | Reference Example 3 | Reference Example 4 |
|---|---|---|---|---|---|---|---|---|---|
| Bonding strength with lead frame (kg/mm²) | 1.3 | 1.4 | 1.5 | 1.3 | 1.0 | 1.5 | 0.5 | 1.0 | 0.6 |
| Lead frame residual rate in mold (%) | 0 | 0 | 0 | 0 | 0 | 20 | 0 | 16 | 6 |

TABLE 4-continued

| | | | | | | | | | |
|---|---|---|---|---|---|---|---|---|---|
| Crack occurrence after VPS treatment (cracked samples/all samples tested) | 0/20 | 0/20 | 0.20 | 0/20 | 1/20 | 0/20 | 9/20 | 0/20 | 5/20 |
| Humidity resistance reliability test (defective samples/all samples tested) | | | | | | | | | |
| 40H | 0/20 | 0/20 | 0/20 | 0/20 | 0/20 | 0/20 | 0/20 | 0/20 | 0/20 |
| 80H | 0/20 | 0/20 | 0/20 | 0/20 | 0/20 | 0/20 | 0/20 | 0/20 | 0/20 |
| 160H | 0/20 | 0/20 | 0/20 | 0/20 | 0/20 | 0/20 | 3/20 | 0/20 | 1/20 |
| 320H | 0/20 | 0/20 | 0/20 | 0/20 | 1/20 | 0/20 | 6/20 | 0/20 | 2/20 |
| 500H | 0/20 | 0/20 | 0/20 | 0/20 | 2/20 | 0/20 | 7/20 | 2/20 | 6/20 |

As apparent from Table 4, the epoxy resin compositions for Examples 4 to 18 were superior to the compositions for Reference Examples 1 to 4 in the bonding strength of the molded product with the lead frame made of 42 alloy. Also, a residual lead frame within the mold was not found in the Examples of the present invention, indicating that the epoxy resin composition defined in the present invention exhibits excellent mold release characteristics. Further, crack occurrence was suppressed even after the VPS treatment when it comes to the resin encapsulation type semiconductor device of the present invention manufactured by using the epoxy resin composition defined in the present invention. Still further, the resin encapsulation type semiconductor device of the present invention was found to exhibit an excellent performance in the humidity resistance reliability test conducted after the cracking resistance test. It follows that the resin encapsulation type semiconductor device corresponding to any of Examples 4 to 18, which are excellent in the mold release characteristics in the manufacturing process, permits improving the manufacturing efficiency of the device and enables the manufactured device to exhibit a satisfactory reliability in terms of its resistance to humidity.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A resin encapsulation type semiconductor device, comprising a semiconductor element encapsulated with an epoxy resin composition, said composition containing as essential components:

(a) an epoxy resin represented by formula (I) given below:

(I)

where $R^1$, $R^2$, $R^3$, and $R^4$ are hydrogen or an alkyl group respectively, and $n \geq 0$, (b) a phenolic resin curing agent,
(c) an imidazole compound, and
(d) triphenyl phosphate or a derivative thereof.

2. The resin encapsulation type semiconductor device according to claim 1, wherein said epoxy resin composition further contains an inorganic filler.

3. The resin encapsulation type semiconductor device according to claim 1, wherein said epoxy resin composition further contains an epoxy resin having a chemical structure differing from that of said epoxy resin (a).

4. The resin encapsulation type semiconductor device according to claim 1, wherein said phenolic resin curing agent (b) is a phenolic resin represented by formula (III) given below:

(III)

where $R^5$ and $R^6$, which may be the same or different, are hydrogen or an alkyl group having 1 to 20 carbon atoms, and $R^7$ is a single bond or an alkylene group.

5. The resin encapsulation type semiconductor device according to claim 1, wherein the mixing ratio of said epoxy resin (a) and said phenolic resin curing agent (b) contained in said epoxy resin composition falls within a range of between about 0.5 and 1.5 in terms of the ratio of the number of the phenolic hydroxyl groups of the phenolic resin to the number of epoxy groups of said epoxy resin.

6. The resin encapsulation type semiconductor device according to claim 1, wherein said imidazole compound (c) is an imidazole compound having a long chain alkyl group having at least 11 carbon atoms or a phenyl group bonded at 2-position and hydrogen or a methyl group bonded at 4-position.

7. The resin encapsulation type semiconductor device according to claim 1, wherein said imidazole compound (c) is contained in the epoxy resin composition in an amount of about 0.1 to 5% by weight based on the total weight of the resin components comprising the epoxy resin (a) and the phenolic resin curing agent (b).

8. The resin encapsulation type semiconductor device according to claim 1, wherein said triphenyl phosphate or a derivative thereof (d) is contained in the epoxy resin composition in an amount of about 0.1 to 5% by weight based on the total weight of the resin components comprising the epoxy resin (a) and the phenolic resin curing agent (b).

9. A resin encapsulation type semiconductor device, comprising a semiconductor element encapsulated with an epoxy resin composition, said composition containing as essential components:

(a) an epoxy resin represented by formula (I) given below:

where $R^1$, $R^2$, $R^3$, and $R^4$ are hydrogen or an alkyl group respectively, and $n \geq 0$, (b) a phenolic resin curing agent, and

(c) a mold release agent of a three-component system consisting essentially of an ester-based wax, an oxidized paraffin wax and an olefin-based wax.

10. The resin encapsulation type semiconductor device according to claim 9, wherein said epoxy resin composition further contains an imidazole compound as a curing catalyst.

11. The resin encapsulation type semiconductor device according to claim 9, wherein said epoxy resin composition further contains an inorganic filler.

12. The resin encapsulation type semiconductor device according to claim 9, wherein said epoxy resin composition further contains an epoxy resin having a chemical structure differing from that of said epoxy resin (a).

13. The resin encapsulation type semiconductor device according to claim 9, wherein said phenolic resin curing agent (b) is a phenolic resin represented by formula (III) given below:

where $R^5$ and $R^6$, which may be the same or different, are hydrogen or an alkyl group having 1 to 20 carbon atoms, and $R^7$ is a single bond or an alkylene group.

14. The resin encapsulation type semiconductor device according to claim 9, wherein the mixing ratio of said epoxy resin (a) and said phenolic resin curing agent (b) contained in said epoxy resin composition falls within a range of between about 0.5 and 1.5 in terms of the ratio of the number of the phenolic hydroxyl groups of the phenolic resin to the number of epoxy groups of said epoxy resin.

15. The resin encapsulation type semiconductor device according to claim 9, wherein said ester-based wax acting as one component of the mold release agent (e) is an ester obtained by the reaction between a monovalent higher fatty acid and a monovalent higher alcohol.

16. The resin encapsulation type semiconductor device according to claim 9, wherein said oxidized paraffin wax acting as one component of the mold release agent (e) is a mixture of higher alcohols, higher fatty acids and esters, said mixture being obtained by oxidizing a hydrocarbon.

17. The resin encapsulation type semiconductor device according to claim 9, wherein said olefin-based wax acting as one component of the mold release agent (e) is a low molecular weight polyethylene or a low molecular weight polypropylene each having a molecular weight of 500 to 5,000.

18. The resin encapsulation type semiconductor device according to claim 9, wherein the mixing ratio of said ester-based wax, said oxidized paraffin wax and said olefin-based wax, which collectively form said mold release agent (e), is: $30 \leq x \leq 92$, $5 \leq y \leq 67$, $3 \leq z \leq 20$, and $x + Y + z = 100$, where x denotes the percentage by weight of the ester-based wax, y denotes the percentage by weight of the oxidized paraffin wax, and z denotes the percentage by weight of the olefin-based wax.

19. The resin encapsulation type semiconductor device according to claim 9, wherein said mold release agent (e) is contained in the epoxy resin composition in an amount of 0.3 to 0.8% by weight in the amount of the epoxy resin composition and in an amount of 1.5 to 4.5% by weight based on the total amount of the epoxy resin and the curing agent contained in the composition.

20. A resin encapsulation type semiconductor device, comprising a semiconductor element encapsulated with an epoxy resin composition, said composition containing as indispensable components:

(a) an epoxy resin represented by general formula (I) given below:

where $R^1$, $R^2$, $R^3$, and $R^4$ are hydrogen or an alkyl group respectively, and $n \geq 0$, (b) a phenolic resin curing agent, (c) an imidazole compound, (d) triphenyl phosphate or a derivative thereof, and (e) a mold release agent of a three-component system consisting essentially of an ester-based wax, an oxidized paraffin wax and an olefin-based wax.

* * * * *